(12) United States Patent
Wang et al.

(10) Patent No.: US 8,450,733 B2
(45) Date of Patent: May 28, 2013

(54) OXIDE SEMICONDUCTOR THIN FILM TRANSISTOR, AND METHOD OF MANUFACTURING THE SAME

(75) Inventors: Seong-Min Wang, Yongin (KR); Joo-Sun Yoon, Yongin (KR); Tae-An Seo, Yongin (KR); Jeong-Hwan Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/075,117

(22) Filed: Mar. 29, 2011

(65) Prior Publication Data

US 2012/0119206 A1    May 17, 2012

(30) Foreign Application Priority Data

Nov. 15, 2010    (KR) .................. 10-2010-0113326

(51) Int. Cl.
*H01L 29/10* (2006.01)
*H01L 31/00* (2006.01)
*H01L 21/00* (2006.01)
*H01L 21/84* (2006.01)

(52) U.S. Cl.
USPC ............. 257/43; 257/59; 438/104; 438/158

(58) Field of Classification Search
USPC ........................................ 257/43, 59
See application file for complete search history.

(56) References Cited

U.S. PATENT DOCUMENTS

| | | | | |
|---|---|---|---|---|
| 5,920,084 | A * | 7/1999 | Gu et al. | 257/59 |
| 7,705,360 | B2 * | 4/2010 | Cho | 257/72 |
| 2003/0103181 | A1 * | 6/2003 | Imayama et al. | 349/122 |
| 2005/0018114 | A1 * | 1/2005 | Park et al. | 349/114 |
| 2006/0071211 | A1 * | 4/2006 | Lee | 257/59 |
| 2009/0256147 | A1 * | 10/2009 | Kim et al. | 257/43 |
| 2010/0044699 | A1 * | 2/2010 | Chung et al. | 257/43 |
| 2010/0117088 | A1 * | 5/2010 | Yoon | 257/59 |

\* cited by examiner

*Primary Examiner* — Long Tran
*Assistant Examiner* — Dzung Tran
(74) *Attorney, Agent, or Firm* — Christie, Parker & Hale, LLP

(57) ABSTRACT

An oxide semiconductor thin film transistor includes a gate electrode on a substrate, the gate electrode having a first area, a gate insulation layer on the gate electrode, the gate insulation layer covering the gate electrode, an active layer on the gate insulation layer, the active layer having a second area that is smaller than the first area, a source electrode on the active layer, the source electrode contacting a source region of the active layer, a drain electrode on the active layer, the drain electrode contacting a drain region of the active layer, and a passivation layer covering the active layer, the source electrode, and the drain electrode.

13 Claims, 12 Drawing Sheets

OXIDE SEMICONDUCTOR THIN FILM TRANSISTOR, AND METHOD OF MANUFACTURING THE SAME

CROSS-REFERENCE TO RELATED APPLICATION

This application claims priority under 35 U.S.C. §119 to Korean patent Application No. 2010-0113326 filed on Nov. 15, 2010, the disclosure of which is hereby incorporated by reference herein in its entirety.

BACKGROUND

1. Field

Embodiments of the present invention relate to a thin film transistor (TFT). More particularly, embodiments of the present invention relate to an oxide semiconductor thin film transistor and a method of manufacturing the oxide semiconductor thin film transistor.

2. Description of Related Art

Recently, an oxide semiconductor thin film transistor has been widely used as a switching element or as a driving element in a display device such as a liquid crystal display (LCD) device, an organic light emitting display (OLED) device, etc. In particular, the oxide semiconductor thin film transistor is used to provide high durability and high reliability against a high voltage that is applied to its gate electrode to be used as a fundamental structure for a gate scan circuit, a backplane, etc. of the display device. However, a conventional oxide semiconductor thin film transistor may easily deteriorate and malfunction when a high voltage is continuously applied to its gate electrode.

SUMMARY

Embodiments of the present invention provide an oxide semiconductor thin film transistor having high durability and high reliability against a high voltage that is continuously applied to its gate electrode.

Embodiments of the present invention provide a method of manufacturing the oxide semiconductor thin film transistor.

According to one embodiment of the present invention, an oxide semiconductor thin film transistor includes a gate electrode on a substrate, the gate electrode having a first area, a gate insulation layer on the gate electrode, the gate insulation layer covering the gate electrode, an active layer on the gate insulation layer, the active layer having a second area that is smaller than the first area, a source electrode on the active layer, the source electrode contacting a source region of the active layer, a drain electrode on the active layer, the drain electrode contacting a drain region of the active layer, and a passivation layer covering the active layer, the source electrode, and the drain electrode.

The gate insulation layer may include a protrusion having a third area that is smaller than the second area of the active layer.

A central region of the active layer may be raised in comparison to a peripheral region of the active layer in a region corresponding to the protrusion of the gate insulation layer.

The central region of the active layer may include a channel region of the active layer. Additionally, the peripheral region of the active layer may include the source region of the active layer and the drain region of the active layer.

The oxide semiconductor thin film transistor may further include an etch stopper layer between the active layer and both of the source electrode and the drain electrode.

The etch stopper layer may have a contact hole structure in which the source electrode and the drain electrode contact the active layer through a plurality of contact holes in the etch stopper layer.

The etch stopper layer may have an island structure in which the source electrode and the drain electrode contact a peripheral region of the active layer, the peripheral region having the source region and the drain region.

The active layer may include an oxide material that includes at least one of indium (In), zinc (Zn), gallium (Ga), or tin (Sn).

The oxide material may further include at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F).

An electron carrier concentration of the oxide material may be from about $10^{12}/cm^3$ to about $10^{18}/cm^3$.

According to another embodiment of the present invention, a method of manufacturing an oxide semiconductor thin film transistor includes forming a gate electrode on a substrate, the gate electrode having a first area, forming a gate insulation layer on the gate electrode, the gate insulation layer covering the gate electrode, forming an active layer on the gate insulation layer, the active layer having a second area that is smaller than the first area, forming a source electrode and a drain electrode on the active layer, the source electrode contacting a source region of the active layer, and the drain electrode contacting a drain region of the active layer on the active layer, and forming a passivation layer covering the active layer, the source electrode, and the drain electrode.

The method of manufacturing the oxide semiconductor thin film transistor may further include forming an etch stopper layer between the active layer and both of the source electrode and the drain electrode.

The gate insulation layer may include a protrusion having a third area that is smaller than the second area of the active layer.

A central region of the active layer may be raised in comparison to a peripheral region of the active layer in a region corresponding to the protrusion of the gate insulation layer.

The central region of the active layer may include a channel region of the active layer. Additionally, the peripheral region of the active layer may include the source region of the active layer and the drain region of the active layer.

According to embodiments of the present invention, an oxide semiconductor thin film transistor may be used as a fundamental structure for a gate scan circuit, a backplane, etc. of a display device (e.g., a LCD device, an OLED device, etc.) because the oxide semiconductor thin film transistor may not easily deteriorate and malfunction even when a high voltage is continuously applied to its gate electrode. Furthermore, by a method of manufacturing an oxide semiconductor thin film transistor, an oxide semiconductor thin film transistor having high durability and high reliability against a high voltage that is continuously applied to its gate electrode may be manufactured.

BRIEF DESCRIPTION OF THE DRAWINGS

Embodiments of the present invention can be understood in more detail from the following description taken in conjunction with the accompanying drawings, in which.

DETAILED DESCRIPTION

Figure 1:
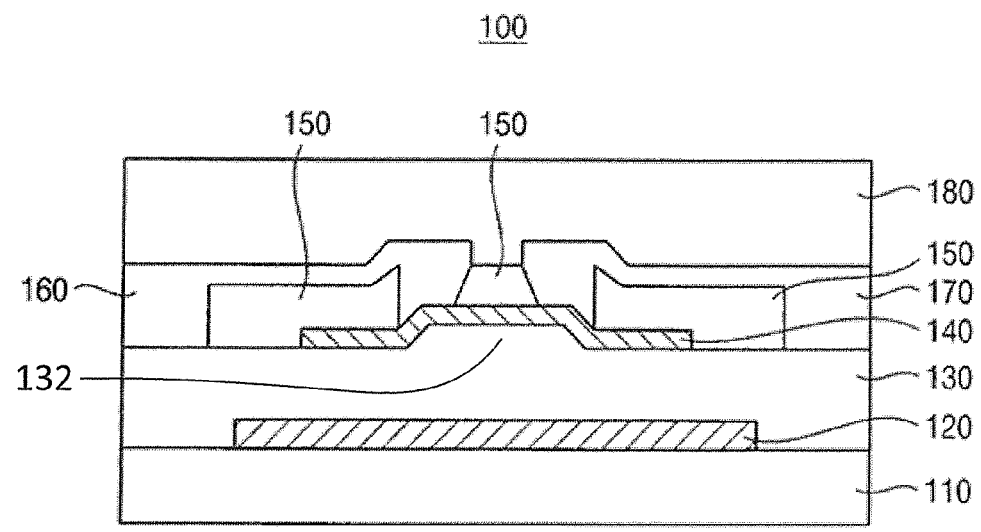
FIG. 1 is a cross-sectional view illustrating an oxide semiconductor thin film transistor in accordance with one embodiment of the present invention.

Embodiments of the present invention are described more fully hereinafter with reference to the accompanying drawings. The present invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross sectional illustrations that are schematic illustrations of illustratively idealized embodiments (and intermediate structures) of the present invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which embodiments of this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an oxide semiconductor thin film transistor in accordance with one embodiment of the present.

Referring to FIG. 1, according to one embodiment of the present invention, the oxide semiconductor thin film transistor 100 has a bottom gate structure. In more detail, the oxide semiconductor thin film transistor 100 includes a substrate 110, a gate electrode 120, a gate insulation layer 130, an active layer 140, an etch stopper layer 150, a source electrode 160, a drain electrode 170, and a passivation layer 180.

Generally, an oxide semiconductor thin film transistor is widely used for a high resolution display device because the oxide semiconductor thin film transistor has characteristics of high carrier mobility and low threshold voltage shift compared to an amorphous silicon semiconductor thin film transistor. However, in a conventional oxide semiconductor thin film transistor, an area (e.g., width) of an active layer is required to be greater than an area (e.g., width) of a gate electrode because parasitic capacitances may be formed between the gate electrode and the active layer. For example, in a display device using the conventional oxide semiconductor thin film transistor, a kickback phenomenon, in which a voltage of a pixel electrode is greatly fluctuated due to the parasitic capacitance as a voltage applied to the gate electrode is changed, may be caused (e.g., observed). However, the oxide semiconductor thin film transistor 100 may include the gate electrode 120 of which an area (e.g., width) is greater than an area (e.g., width) of the active layer 140. In addition, the oxide semiconductor thin film transistor 100 may further include the etch stopper layer 150. As a result, the oxide semiconductor thin film transistor 100 may reduce or prevent the parasitic capacitance formed between the gate electrode 120 and the active layer 140. Hereinafter, the oxide semiconductor thin film transistor 100 will be described in more detail.

As described above, the oxide semiconductor thin film transistor 100 has a bottom gate structure (e.g., a reverse staggered structure). Thus, the substrate 110, the gate electrode 120, the gate insulation layer 130, the active layer 140, the etch stopper layer 150, the source/drain electrodes 160 and 170, and the passivation layer 180 may be sequentially formed. The substrate 110 may correspond to a silicon semiconductor substrate, a glass substrate, a plastic substrate, etc. The gate electrode 120 that is formed on the substrate 110 has a first area that is greater than a second area of the active layer 140. Here, the gate electrode 120 may be formed using a conductive polymer or a metal such as Aluminum (Al), Chromium (Cr), Molybdenum (Mo), Molybdenum-Tungsten (MoW), etc. In some embodiments, the gate electrode 120 is formed by depositing a metal on the substrate 110 and by patterning the metal deposited on the substrate 110. The metal deposited on the substrate 110 may have a single layer structure or a multiple layer structure. According to some embodiments, a buffer layer is placed between the substrate 110 and the gate electrode 120. The gate insulation layer 130 may be formed on the gate electrode 120 by covering the gate electrode 120. Here, the gate insulation layer 130 may be formed using an insulation material (e.g., $SiO_2$, $SiN_x$, $Ga_2$, $O_3$, etc.) such as a silicon oxide, a silicon nitride, etc. Thus, the gate insulation layer 130 may insulate the gate electrode 120 from the active layer 140. In some embodiments, the gate insulation layer 130 has a protrusion 132 (e.g., a raised portion) at a region corresponding to a central region of the gate electrode 120. Here, a third area of the protrusion 132 of the gate insulation layer 130 may be smaller than the second area of the active layer 140. Further, the protrusion 132 of the gate insulation layer 130 may determine a shape of the active layer 140 that is formed on the gate insulation layer 130.

According to one embodiment of the present invention, the active layer 140 is formed on the gate insulation layer 130. The second area of the active layer 140 is smaller than the first area of the gate electrode 120 and is greater than the third area of the protrusion 132 of the gate insulation layer 130. As illustrated in FIG. 1, in one embodiment, the active layer 140 spatially overlaps the gate electrode 120 (e.g., the active layer 140 may be placed over the gate electrode 120). Furthermore, the active layer 140 may have a shape bent by the protrusion 132 of the gate insulation layer 130. For example, a central region of the active layer 140 may protrude compared to (e.g., raised in comparison to) a peripheral region of the active layer 140. As a result, the active layer 140 may include a step height region between the central region and the peripheral region. Typically, the active layer 140 includes a channel region, a source region, and a drain region. Here, the central region of the active layer 140 may include the channel region, and the peripheral region of the active layer 140 may include the source region and the drain region. The active layer 140 may be formed using an oxide material. In more detail, the active layer 140 may be formed using an oxide material that includes at least one of indium (In), zinc (Zn), gallium (Ga), or tin (Sn). Additionally, the oxide material may further include at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F). For example, the active layer 140 may be formed using an oxide material such as ZnO, ZnGaO, ZnInO, ZnSnO, GaInZnO, SnO2, CdSnO, GaSnO, TiSnO, CuAlO, SrCuO, LaCuOS, etc. However, an oxide material of the active layer 140 is not limited thereto. Here, an electron carrier concentration of the oxide material of the active layer 140 may be from about $10^{12}/cm^3$ to about $10^{18}/cm^3$. As a result, the oxide semiconductor thin film transistor 100 may reduce leakage currents in an off-state, may increase saturation currents in a pinch-off state and may enhance on-off characteristics. According to some embodiments, a surface stabilization layer is placed between the active layer 140 and the gate insulation layer 130.

According to one embodiment of the present invention, the etch stopper layer 150 is formed on the active layer 140 by covering some portions of the active layer 140. For example, according to one embodiment of the present invention, the etch stopper layer 150 covers non-contact regions of the active layer 140 and does not cover contact regions of the active layer 140. Here, contact regions of the active layer 140 indicate some portions of the active layer 140 that the source electrode 160 and the drain electrode 170 contact, and non-contact regions of the active layer 140 indicate some portions of the active layer 140 that the source electrode 160 and the drain electrode 170 do not contact. In some embodiments, the etch stopper layer 150 is formed by forming a layer having an etch stopper material on the active layer 140 and by etching some portions of the layer that are over the source region and the drain region of the active layer 140. Hence, the etch stopper layer 150 may have contact holes that expose a portion of the source region and a portion of the drain region. Then, the portion of the source region may contact the source electrode 160, and the portion of the drain region may contact the drain electrode 170. In FIG. 1, it is illustrated that the etch stopper layer 150 has a contact hole structure in which the source electrode 160 and the drain electrode 170 contact the active layer 140 in a hole shape (e.g., through the contact holes of the etch stopper layer 150). However, a structure of the etch stopper layer 150 is not limited thereto. For example, the etch stopper layer 150 may have an island structure in which the source electrode 160 and the drain electrode 170 contact a peripheral region of the active layer 140. Therefore, the etch stopper layer 150 may reduce or prevent parasitic capacitances formed between the active layer 140 and the gate electrode 120 by decreasing the contact areas of the active layer 140 with the source electrode 160 and the drain electrode 170. Furthermore, the etch stopper layer 150 may act as a passivation layer for reducing or preventing damage to the active layer 140 when the active layer 140 is exposed to the outside during a manufacturing process of the oxide semiconductor thin film transistor 100.

According to one embodiment of the present invention, the source electrode 160 and the drain electrode 170 are formed on the etch stopper layer 150. As described above, the source electrode 160 contacts the source region of the active layer 140, and the drain electrode 170 contacts the drain region of the active layer 140. Here, the source electrode 160 and the drain electrode 170 may be formed using a metal such as Aluminum (Al), Chromium (Cr), Molybdenum (Mo), Molybdenum-Tungsten (MoW), etc. In some embodiments, the source electrode 160 and the drain electrode 170 are formed by depositing a metal on the etch stopper layer 150 to fill contact holes of the etch stopper layer 150 and by patterning the metal deposited on the etch stopper layer 150. The metal deposited on the etch stopper layer 150 may have a single layer structure or a multiple layer structure. Then, the passivation layer 180 may be formed on the etch stopper layer 150, the source electrode 160, and the drain electrode 170 to cover the etch stopper layer 150, the source electrode 160, and the drain electrode 170. Because the etch stopper layer 150 covers non-contact regions of the active layer 140, the passivation layer 180 may cover the etch stopper layer 150 instead of the active layer 140. In some embodiments, the passivation layer 180 includes at least one of a silicon oxide layer, a silicon nitride layer, an organic insulation layer, etc. As described above, the oxide semiconductor thin film transistor 100 may endure a high voltage that is applied to the gate electrode 120 because the first area of the gate electrode 120 is greater than the second area of the active layer 140 and may reduce or prevent parasitic capacitances formed between the gate electrode 120 and the active layer 140 because the etch stopper layer 150 decreases contact areas of the active layer 140 with the source electrode 160 and the drain electrode 170. Therefore, the oxide semiconductor thin film transistor 100 may have high durability and high reliability against a high voltage that is applied to the gate electrode 120. As a result, the oxide semiconductor thin film transistor 100 may be used as a fundamental structure for a gate scan circuit, a backplane, etc. of a display device.

Figure 2:
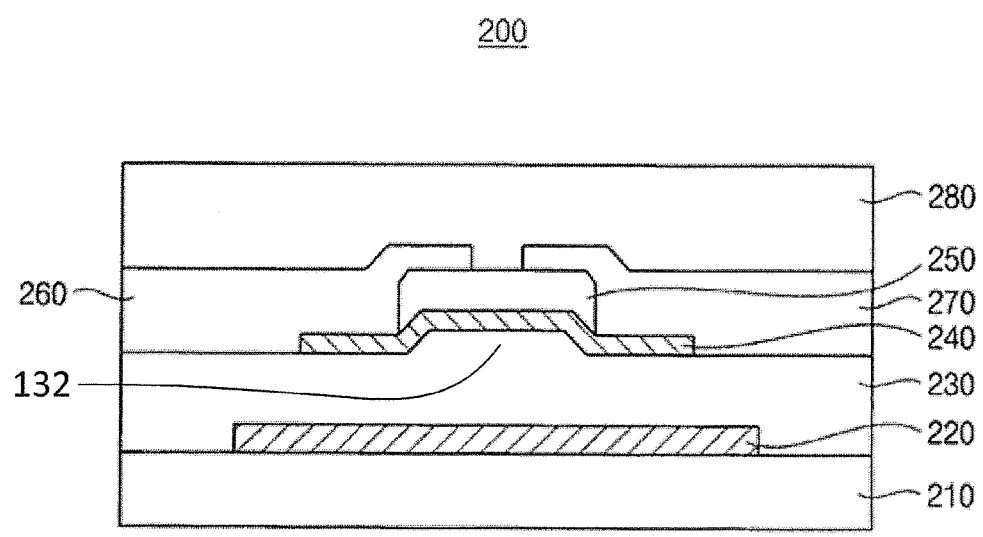
FIG. 2 is a cross-sectional view illustrating an oxide semiconductor thin film transistor of FIG. 1 in accordance with one embodiment of the present invention.

FIG. 2 is a cross-sectional view illustrating an oxide semiconductor thin film transistor of FIG. 1 in accordance with one embodiment of the present invention.

Referring to FIG. 2, in accordance with one embodiment of the present invention, the oxide semiconductor thin film transistor 200 has a bottom gate structure. In more detail, the oxide semiconductor thin film transistor 200 includes a substrate 210, a gate electrode 220, a gate insulation layer 230, an active layer 240, an etch stopper layer 250, a source electrode 260, a drain electrode 270, and a passivation layer 280.

As described above, the oxide semiconductor thin film transistor 100 of FIG. 1 includes the etch stopper layer 150 having a contact hole structure in which the source electrode 160 and the drain electrode 170 contact the active layer 140 in a hole shape (e.g. through the contact holes of the etch stopper layer 150). On the other hand, as illustrated in FIG. 2, the oxide semiconductor thin film transistor 200 includes the etch stopper layer 250 having an island structure in which the source electrode 260 and the drain electrode 270 contact a peripheral region of the active layer 240. Similarly with the oxide semiconductor thin film transistor 100 of FIG. 1, the oxide semiconductor thin film transistor 200 may endure a high voltage that is applied to the gate electrode 220 because a first area of the gate electrode 220 is greater than a second area of the active layer 240 and may reduce or prevent parasitic capacitances formed between the gate electrode 220 and the active layer 240 because the etch stopper layer 250 decreases contact areas of the active layer 240 with the source electrode 260 and the drain electrode 270. Therefore, the oxide semiconductor thin film transistor 200 may have high durability and high reliability against a high voltage that is applied to the gate electrode 220. As a result, the oxide semiconductor thin film transistor 200 may be used as a fundamental structure for a gate scan circuit, a backplane, etc. of a display device.

Figure 3:
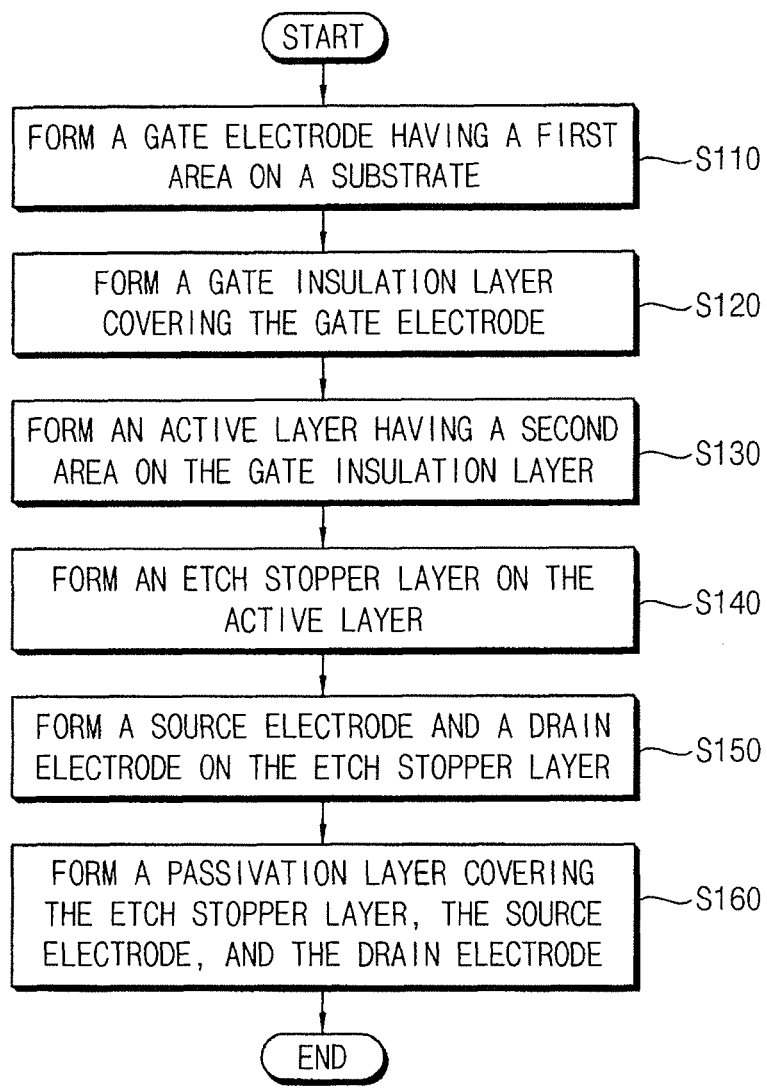
FIG. 3 is a flow chart illustrating a method of manufacturing an oxide semiconductor thin film transistor of FIG. 1 in accordance with one embodiment of the present invention.

FIG. 3 is a flow chart illustrating a method of manufacturing an oxide semiconductor thin film transistor of FIG. 1 in accordance with one embodiment of the present invention.

Referring to FIG. 3, in the method of manufacturing the oxide semiconductor thin film transistor 100 according to one embodiment of the present invention, the gate electrode 120 having the first area is formed on the substrate 110 (S110). The gate insulation layer 130 is formed on the gate electrode 120 to cover the gate electrode 120 (S120). The active layer 140 having the second area is formed on the gate insulation layer 130 (S130). Here, the second area of the active layer 140 may be smaller than the first area of the gate electrode 120. The etch stopper layer 150 is formed on the active layer 140 (S140). The source electrode 160 and the drain electrode 170 are formed on the etch stopper layer 150 (S150). Here, the source electrode 160 contacts the source region of the active layer 140, and the drain electrode 170 contacts the drain region of the active layer 140. The passivation layer 180 is formed on the etch stopper layer 150, the source electrode 160, and the drain electrode 170 (S160) to cover the etch stopper layer 150, the source electrode 160, and the drain electrode 170.

According to one embodiment of the present invention, the gate electrode 120 having the first area is formed on the substrate 110 (S110). As described above, the first area of the gate electrode 120 is greater than the second area of the active layer 140. In some embodiments, the gate electrode 120 is formed by depositing a metal on the substrate 110 and by patterning the metal deposited on the substrate 110. Then, the gate insulation layer 130 is formed on the gate electrode 120 to cover the gate electrode 120 (S120). Here, the gate insulation layer 130 may have a protrusion 132 (e.g., a raised portion) at a region corresponding to the central region of the gate electrode 120. As described above, the third area of the protrusion 132 of the gate insulation layer 130 may be smaller than the second area of the active layer 140. In addition, the protrusion 132 of the gate insulation layer 130 may determine a shape of the active layer 140 that is formed on the gate insulation layer 130. Then, the active layer 140 having the second area is formed on the gate insulation layer 130 (S130). Here, the active layer 140 may have a shape bent by the protrusion 132 of the gate insulation layer 130. For example, the central region of the active layer 140 may protrude compared to (e.g., may be raised in comparison to) the peripheral region of the active layer 140. As a result, the active layer 140 may include a step height region between the central region and the peripheral region. The active layer 140 may spatially overlap the gate electrode 120 (e.g., the active layer 140 may be placed over the gate electrode 120).

Subsequently, the etch stopper layer 150 that covers some portions of the active layer 140 is formed on the active layer 140 (S140). In some embodiments, the etch stopper layer 150 is formed by forming a layer having an etch stopper material on the active layer 140 and by etching some portions of the layer that are over the source region and the drain region of the active layer 140. Then, the source electrode 160 and the drain electrode 170 are formed on the etch stopper layer 150 (S150). In some embodiments, the source electrode 160 and the drain electrode 170 may be formed by depositing a metal on the etch stopper layer 150 to fill contact holes of the etch stopper layer 150 and by patterning the metal deposited on the etch stopper layer 150. Then, the passivation layer 180 are formed on the etch stopper layer 150, the source electrode 160, and the drain electrode 170 (S160). Because the etch stopper layer 150 covers non-contact regions of the active layer 140, the passivation layer 180 may cover the etch stopper layer 150 instead of the active layer 140. According to some embodiments, a buffer layer is placed between the substrate 110 and the gate electrode 120, and a surface stabilization layer is placed between the active layer 140 and the gate insulation layer 130.

Therefore, the method of the embodiment illustrated in FIG. 3 may be used to manufacture the oxide semiconductor thin film transistor 100 in which the first area of the gate electrode 120 is greater than the second area of the active layer 140, and the etch stopper layer 150 is placed between the active layer 140 and the source and drain electrodes 160 and 170. As a result, the oxide semiconductor thin film transistor 100 may have high durability and high reliability against a high voltage that is applied to the gate electrode 120. In reference to FIGS. 4A, 4B, 4C, 4D, 4E, 4F, and 4G below, a manufacturing process of the oxide semiconductor thin film transistor 100 will be described in more detail.

FIGS. 4A, 4B, 4C, 4D, 4E, 4F, and 4G are cross-sectional views illustrating a manufacturing process of an oxide semiconductor thin film transistor of FIG. 1 according to one embodiment of the present invention.

Figure 4A:
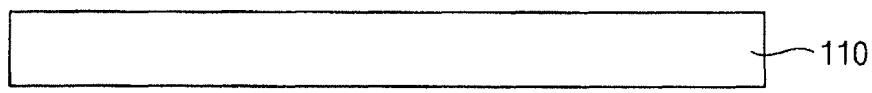
FIGS. 4A, 4B, 4C, 4D, 4E, 4F, and 4G are cross-sectional views illustrating a manufacturing process of an oxide semiconductor thin film transistor of FIG. 1 in accordance with one embodiment of the present invention.

Referring to FIG. 4A, the substrate 110 is provided. For example, the substrate 110 may be a silicon semiconductor substrate, a glass substrate, a plastic substrate, etc.

Figure 4B:
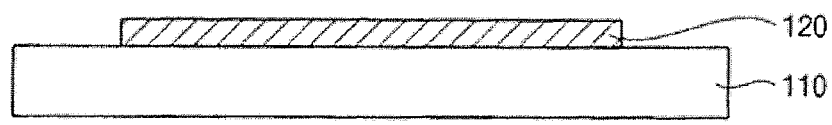

Referring to FIG. 4B, the gate electrode 120 is formed on the substrate 110. Here, the first area of the gate electrode 120 may be greater than the second area of the active layer 140. As a result, the active layer 140 may spatially overlap the gate electrode 120 (e.g., the active layer 140 may be placed over the gate electrode 120). The gate electrode 120 may be formed using a conductive polymer or a metal such as Aluminum (Al), Chromium (Cr), Molybdenum (Mo), Molybdenum-Tungsten (MoW), etc. In some embodiments, the gate electrode 120 is formed by depositing a metal on the substrate 110 and by patterning the metal deposited on the substrate 110. Here, the metal deposited on the substrate 110 may have a single layer structure or a multiple layer structure. According to some embodiments, a buffer layer is placed between the substrate 110 and the gate electrode 120. The buffer layer may perform a buffering function between the substrate 110 and the gate electrode 120. In embodiments in which the buffer layer is placed between the substrate 110 and the gate electrode 120, the gate electrode 120 is formed by depositing a metal on the buffer layer and by patterning the metal deposited on the buffer layer.

Figure 4C:
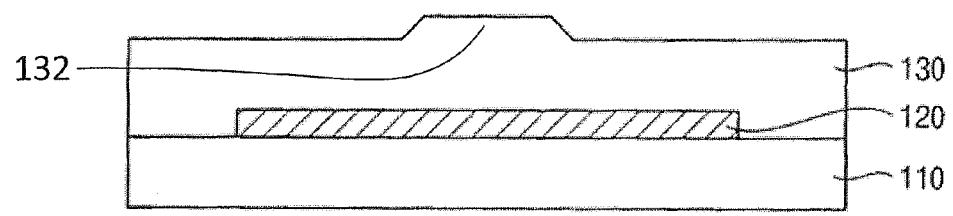

Referring to FIG. 4C, the gate insulation layer 130 is formed on the gate electrode 120 by covering the gate electrode 120. Here, the gate insulation layer 130 may be formed using an insulation material (e.g., $SiO_2$, $SiN_X$, $Ga_2O_3$, etc.) such as a silicon oxide, a silicon nitride, etc. Thus, the gate insulation layer 130 may insulate the gate electrode 120 from the active layer 140. In some embodiments, the gate insulation layer 130 has a protrusion 132 (e.g., be raised) at a region corresponding to the central region of the gate electrode 120. Here, the third area of the protrusion 132 of the gate insulation layer 130 is smaller than the second area of the active layer 140. Further, the protrusion 132 of the gate insulation layer 130 may determine a shape of the active layer 140 that is formed on the gate insulation layer 130. As a result, the active layer 140 may have a shape bent by the protrusion 132 of the gate insulation layer 130. For example, the central region of the active layer 140 may protrude compared to (e.g., may be raised in comparison to) the peripheral region of the active layer 140. According to some embodiments, the surface stabilization layer (e.g., an oxide layer) is formed on the gate insulation layer 130.

Figure 4D:
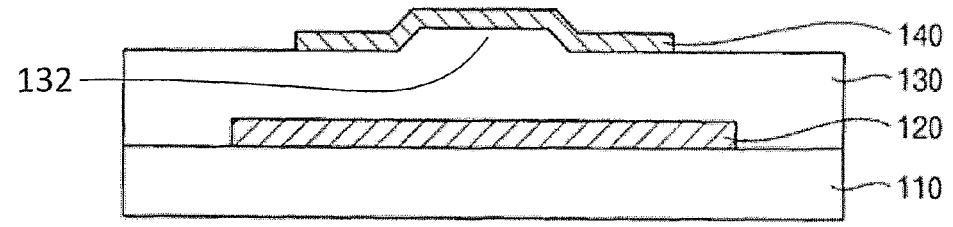

Referring to FIG. 4D, the active layer 140 is formed on the gate insulation layer 130. As described above, the active layer 140 spatially overlaps the gate electrode 120 (e.g., the active layer 140 may be placed over the gate electrode 120). Here, the second area of the active layer 140 is smaller than the first area of the gate electrode 120 and is greater than the third area of the protrusion 132 of the gate insulation layer 130. Thus, the active layer 140 has a shape bent by the protrusion 132 of the gate insulation layer 130. For example, the central region of the active layer 140 protrudes compared to (e.g., is raised in comparison to) the peripheral region of the active layer 140. As a result, the active layer 140 includes a step height region between the central region and the peripheral region. Typically, the active layer 140 includes a channel region, a source region, and a drain region. Here, the central region of the active layer 140 may include the channel region, and the peripheral region of the active layer 140 may include the source region and the drain region.

The active layer 140 may be formed using an oxide material. In more detail, the active layer 140 may be formed using an oxide material that includes at least one of indium (In), zinc (Zn), gallium (Ga), or tin (Sn). In addition, the oxide material may further include at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F). For example, the active layer 140 may be formed using an oxide material such as ZnO, ZnGaO, ZnInO, ZnSnO, GaInZnO, SnO2, CdSnO, GaSnO, TiSnO, CuAlO, SrCuO, LaCuOS, etc. However, an oxide material of the active layer 140 is not limited thereto.

In some embodiments, the active layer 140 is formed by depositing an oxide material on the gate insulation layer 130 using a physical vapor deposition (PVD) technique (e.g., a sputtering technique, an electron beam evaporation technique, a thermal evaporation technique, a laser molecular beam epitaxy evaporation technique, a pulsed laser deposition technique, etc.) and by patterning the oxide material deposited on the gate insulation layer 130. Here, an electron carrier concentration of the oxide material of the active layer 140 may be from about $10^{12}/cm^3$ to about $10^{18}/cm^3$. As a result, the oxide semiconductor thin film transistor 100 may reduce leakage currents in an off-state, may increase saturation currents in a pinch-off state and may enhance on-off characteristics.

Figure 4E:
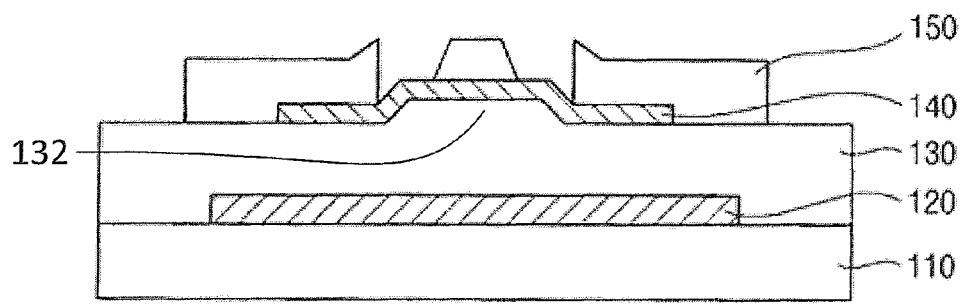

Referring to FIG. 4E, the etch stopper layer 150 is formed on the active layer 140 by covering some portions of the active layer 140. For example, the etch stopper layer 150 covers non-contact regions of the active layer 140 and does not cover contact regions of the active layer 140. Here, contact regions of the active layer 140 indicate some portions of the active layer 140 that the source electrode 160 and the drain electrode 170 contact, and non-contact regions of the active layer 140 indicate some portions of the active layer 140 that the source electrode 160 and the drain electrode 170 do not contact. In some embodiments, the etch stopper layer 150 is formed by forming a layer having an etch stopper material on the active layer 140 and by etching some portions of the layer that are over the source region and the drain region of the active layer 140. Hence, the etch stopper layer 150 may have contact holes that expose a portion of the source region and a portion of the drain region. Then, the portion of the source region may contact the source electrode 160, and the portion of the drain region may contact the drain electrode 170. According to structures of the etch stopper layer 150, positions and shapes of contact holes of the etch stopper layer 150 may be changed. For example, as illustrated in FIG. 1, according to one embodiment of the present invention, the etch stopper layer 150 has a contact hole structure in which the source electrode 160 and the drain electrode 170 contact the active layer 140 in a hole shape (e.g., through the contact holes of the etch stopper layer 150). However, as illustrated in FIG. 2, according to another embodiment of the present invention, the etch stopper layer 150 may have an island structure in which the source electrode 160 and the drain electrode 170 contact a peripheral region of the active layer 140.

As described above, in the oxide semiconductor thin film transistor 100, the first area of the gate electrode 120 may be greater than the second area of the active layer 140. Typically, in a conventional oxide semiconductor thin film transistor 100, parasitic capacitances may be formed between the gate electrode 120 and the active layer 140. However, as illustrated in FIG. 4E, the oxide semiconductor thin film transistor 100 includes the etch stopper layer 150 that reduces or prevents parasitic capacitances formed between the active layer 140 and the gate electrode 120 by decreasing the contact areas of the active layer 140 with the source electrode 160 and the drain electrode 170. Furthermore, the etch stopper layer 150 may be formed using an inorganic oxide that has a bond characteristic with Oxygen. Hence, the etch stopper layer 150 may act as a passivation layer for reducing or preventing damage to the active layer 140 when the active layer 140 is exposed to the outside during a manufacturing process of the oxide semiconductor thin film transistor 100.

Figure 4F:
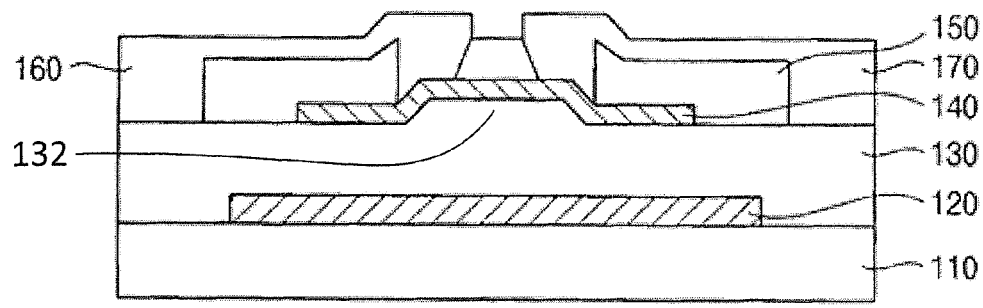

Referring to FIG. 4F, the source electrode 160 and the drain electrode 170 are formed on the etch stopper layer 150. As described above, the source electrode 160 and the drain electrode 170 may be formed using a metal such as Aluminum (Al), Chromium (Cr), Molybdenum (Mo), Molybdenum-Tungsten (MoW), etc. In some embodiments, the source electrode 160 and the drain electrode 170 are formed by depositing a metal on the etch stopper layer 150 to fill contact holes of the etch stopper layer 150 and by patterning the metal deposited on the etch stopper layer 150. Here, the metal deposited on the etch stopper layer 150 may have a single layer structure or a multiple layer structure. In addition, the source electrode 160 and the drain electrode 170 may contact the source region of the active layer 140 and the drain region of the active layer 140, respectively. For example, in embodiments in which the etch stopper layer 150 has a contact hole structure, the source electrode 160 and the drain electrode 170 contact the source region of the active layer 140 and the drain region of the active layer 140 in a hole shape, respectively. On the other hand, in embodiments in which the etch stopper layer 150 has an island structure, the source electrode 260 and the drain electrode 270 contact a peripheral region of the active layer 140, respectively.

Figure 4G:
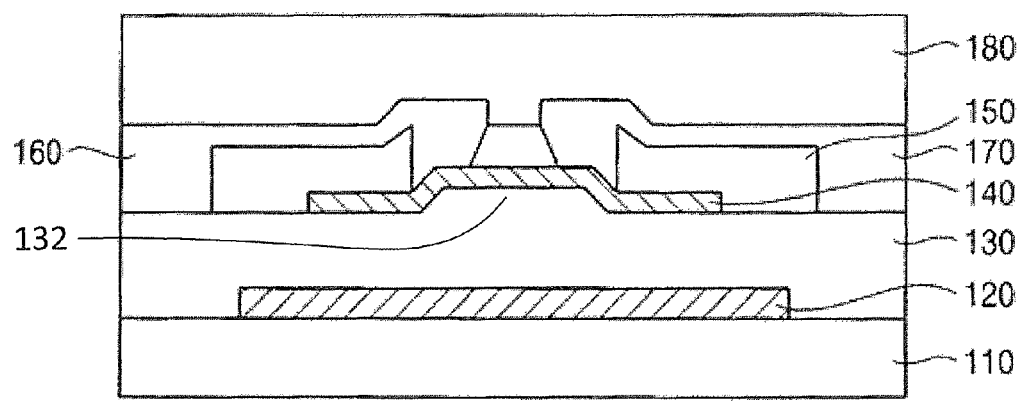

Referring to FIG. 4G, the passivation layer 180 is formed on the etch stopper layer 150, the source electrode 160, and the drain electrode 170 to cover the etch stopper layer 150, the source electrode 160, and the drain electrode 170. As described above, because the etch stopper layer 150 covers non-contact regions of the active layer 140, the passivation layer 180 may cover the etch stopper layer 150 instead of the active layer 140. In some embodiments, the passivation layer 180 is formed by depositing at least one of a silicon oxide layer, a silicon nitride layer, an organic insulation layer, etc. The oxide semiconductor thin film transistor 100 may endure a high voltage that is applied to the gate electrode 120 because the first area of the gate electrode 120 is greater than the second area of the active layer 140 and may reduce or prevent parasitic capacitances formed between the gate electrode 120 and the active layer 140 because the etch stopper layer 150 decreases contact areas of the active layer 140 with the source electrode 160 and the drain electrode 170. Therefore, the oxide semiconductor thin film transistor 100 may have high durability and high reliability against a high voltage that is applied to the gate electrode 120. As a result, the oxide semiconductor thin film transistor 100 may be used as a fundamental structure for a gate scan circuit, a backplane, etc. of a display device.

Figure 5:
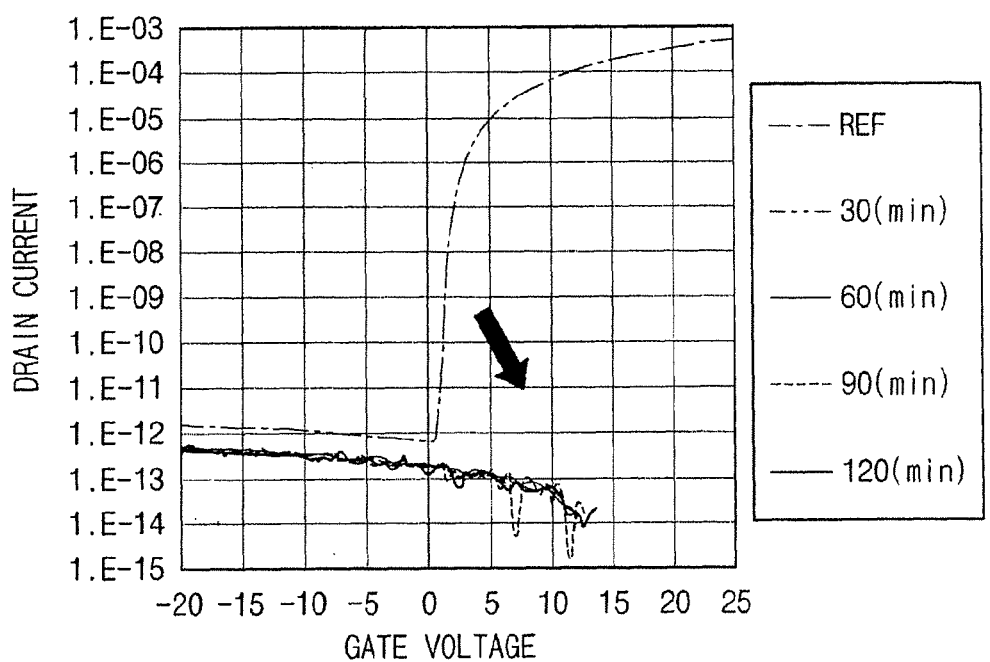
FIG. 5 is a graph illustrating durability and reliability against a high voltage with regard to a conventional oxide semiconductor thin film transistor.
Figure 6:
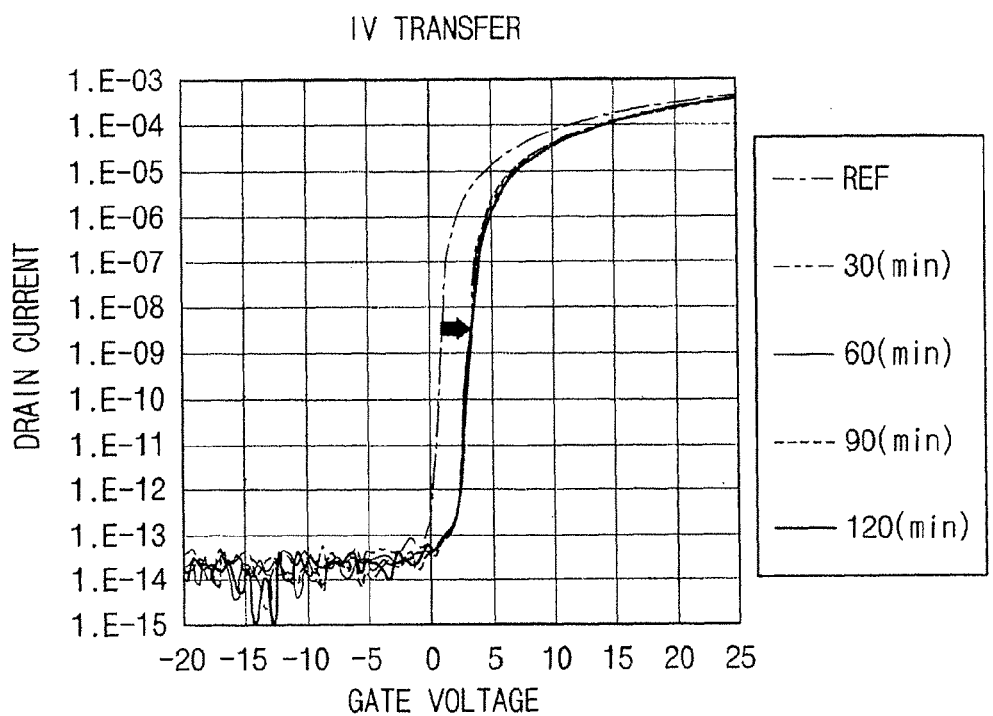
FIG. 6 is a graph illustrating durability and reliability against a high voltage with regard to an oxide semiconductor thin film transistor of FIG. 1 in accordance with one embodiment of the present invention.

FIG. 5 is a graph illustrating durability and reliability against a high voltage with regard to a conventional oxide semiconductor thin film transistor against a high voltage. FIG. 6 is a graph illustrating durability and reliability against a high voltage with regard to an oxide semiconductor thin film transistor of FIG. 1 in accordance with one embodiment of the present invention.

Referring to FIGS. 5 and 6, a current-voltage (IV) transfer characteristic of an oxide semiconductor thin film transistor is illustrated. In more detail, the IV transfer characteristic indicates that a drain current Id flowing through a drain electrode changes according to a gate voltage Vg applied to a gate electrode and that a threshold voltage Vth changes in accordance with a stress time. In FIGS. 5 and 6, the IV transfer characteristic is estimated by applying a gate-source voltage Vgs of about 45V into an oxide semiconductor thin film transistor of which a channel width/length (W/L) ratio is 50:10 μm for a stress time of up to 2 hours. Here, a waveform REF indicates the IV transfer characteristic of a reference state, a waveform 30 (min) indicates the IV transfer characteristic after 30 minutes are elapsed, a waveform 60 (min) indicates the IV transfer characteristic after 60 minutes are elapsed, a waveform 90 (min) indicates the IV transfer characteristic after 90 minutes are elapsed, and a waveform 120 (min) indicates the IV transfer characteristic after 120 minutes are elapsed.

As illustrated in FIG. 5, when a high voltage is applied to a gate electrode of a conventional oxide semiconductor thin film transistor, the IV transfer characteristic of the reference state may not be maintained because deterioration and/or destruction of the conventional oxide semiconductor thin film transistor are caused (e.g., observed). Actually, in a display device such as a LCD device, an OLED device, etc., the gate-source voltage Vgs of about 45V may be applied to the conventional oxide semiconductor thin film transistor during every frame when the conventional oxide semiconductor thin film transistor is used as a fundamental structure of a gate-scan circuit in the display device. As a result, the display device may have some defects, such as a gate block defect (GBD), a gate open defect (G/O), etc., because deterioration and/or destruction of the conventional oxide semiconductor thin film transistor are caused (e.g., observed) due to the high voltage (e.g., the gate-source voltage Vgs of about 45V). Furthermore, in a display device such as a LCD device, an OLED device, etc., a driving voltage that is more than about 40V may be applied to the conventional oxide semiconductor thin film transistor when the conventional oxide semiconductor thin film transistor is used as a fundamental structure of a backplane in the display device. As a result, the display device may malfunction because deterioration and/or destruction of the conventional oxide semiconductor thin film transistor are caused (e.g., observed) due to the high voltage (e.g., the driving voltage that is more than about 40V).

However, as illustrated in FIG. 6, the oxide semiconductor thin film transistor 100 of the embodiment shown in FIG. 1 may endure a high voltage that is continuously applied to its gate electrode 120. That is, the IV transfer characteristic of the reference state may be substantially maintained even when a high voltage is applied to the oxide semiconductor thin film transistor 100 of FIG. 1. For example, even when the gate-source voltage Vgs of about 45V is continuously applied to the oxide semiconductor thin film transistor 100 of FIG. 1, the threshold voltage Vth may be changed by about 2.6V (e.g., from about 1.35V to about 3.9V) after 120 minutes have elapsed. As described above, the oxide semiconductor thin film transistor 100 of FIG. 1 may have high durability and high reliability against a high voltage because the first area of the gate electrode 120 is greater than the second area of the active layer 140, and the etch stopper layer 150 decreases contact areas of the active layer 140 with the source electrode 160 and the drain electrode 170 (e.g., the etch stopper layer 150 may reduce or prevent parasitic capacitances formed between the gate electrode 120 and the active layer 140). Thus, the oxide semiconductor thin film transistor 100 of FIG. 1 may be used as a fundamental structure for the gate scan circuit, the backplane, etc. of the display device such as the LCD device and the OLED device.

Figure 7:
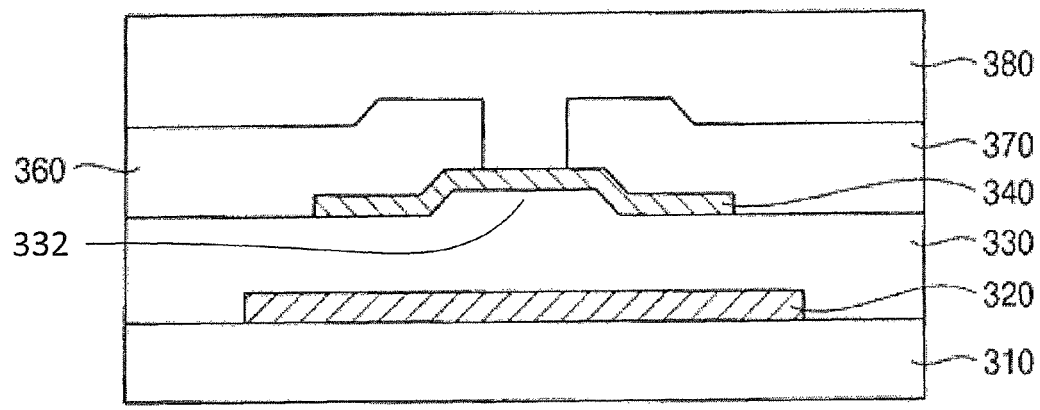
FIG. 7 is a cross-sectional view illustrating an oxide semiconductor thin film transistor in accordance with embodiments of the present invention.

FIG. 7 is a cross-sectional view illustrating an example of an oxide semiconductor thin film transistor in accordance with embodiments of the present invention.

Referring to FIG. 7, the oxide semiconductor thin film transistor 300 may have a bottom gate structure. In more detail, according to one embodiment of the present invention, the oxide semiconductor thin film transistor 300 includes a substrate 310, a gate electrode 320, a gate insulation layer 330, an active layer 340, a source electrode 360, a drain electrode 370, and a passivation layer 380.

The oxide semiconductor thin film transistor 300 has a bottom gate structure (e.g., a reverse staggered structure). Thus, the substrate 310, the gate electrode 320, the gate insulation layer 330, the active layer 340, the source/drain electrodes 360 and 370, and the passivation layer 380 may be sequentially formed. The substrate 310 may correspond to a silicon semiconductor substrate, a glass substrate, a plastic substrate, etc. The gate electrode 320 that is formed on the substrate 310 has a first area (e.g., width) that is greater than a second area (e.g., width) of the active layer 340. Here, the gate electrode 320 may be formed using a conductive polymer or a metal such as Aluminum (Al), Chromium (Cr), Molybdenum (Mo), Molybdenum-Tungsten (MoW), etc. In some embodiments, the gate electrode 320 is formed by depositing a metal on the substrate 310 and by patterning the metal deposited on the substrate 310. The metal deposited on the substrate 310 may have a single layer structure or a multiple layer structure. According to some embodiments, a buffer layer is placed between the substrate 310 and the gate electrode 320. The gate insulation layer 330 may be formed on the gate electrode 320 by covering the gate electrode 320. Here, the gate insulation layer 330 may be formed using an insulation material (e.g., $SiO_2$, $SiN_X$, $Ga_2O_3$, etc.) such as a silicon oxide, a silicon nitride, etc. Thus, the gate insulation layer 330 may insulate the gate electrode 320 from the active layer 340. In some embodiments, the gate insulation layer 330 has a protrusion 332 (e.g., a raised portion) at a region corresponding to a central region of the gate electrode 320. Here, a third area (e.g., width) of the protrusion 332 of the gate insulation layer 330 may be smaller than the second area (e.g., width) of the active layer 340. Further, the protrusion 332 of the gate insulation layer 330 may determine a shape of the active layer 340 that is formed on the gate insulation layer 330.

The active layer 340 is formed on the gate insulation layer 330. In addition, the second area of the active layer 340 is smaller than the first area of the gate electrode 320 and is greater than the third area of the protrusion 332 of the gate insulation layer 330. As illustrated in FIG. 7, the active layer 340 spatially overlaps the gate electrode 320 (e.g., the active layer 340 may be placed over the gate electrode 320). Furthermore, the active layer 340 has a shape bent by the protrusion 332 of the gate insulation layer 330. For example, a central region of the active layer 340 protrudes compared to (e.g., is raised in comparison to) a peripheral region of the active layer 340. As a result, the active layer 340 includes a step height region between the central region and the peripheral region. Typically, the active layer 340 provides a channel region, a source region, and a drain region. Here, the central region of the active layer 340 includes the channel region, and the peripheral region of the active layer 340 includes the source region and the drain region. The active layer 340 may be formed using an oxide material. In more detail, the active layer 340 may be formed using an oxide material that includes at least one of indium (In), zinc (Zn), gallium (Ga), or tin (Sn). Additionally, the oxide material may further include at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F). For example, the active layer 340 may be formed using an oxide material such as ZnO, ZnGaO, ZnInO, ZnSnO, GaInZnO, SnO2, CdSnO, GaSnO, TiSnO, CuAlO, SrCuO, LaCuOS, etc. However, an oxide material of the active layer 340 is not limited thereto. Here, an electron carrier concentration of the oxide material of the active layer 340 may be from about $10^{12}/cm^3$ to about $10^{18}/cm^3$. As a result, the oxide semiconductor thin film transistor 300 may reduce leakage currents in an off-state, may increase saturation currents in a pinch-off state and may enhance on-off characteristics. According to some embodiments, a surface stabilization layer is placed between the active layer 340 and the gate insulation layer 330.

Then, the source electrode 360 and the drain electrode 370 are formed on the active layer 340. As described above, the source electrode 360 contacts the source region of the active layer 340, and the drain electrode 370 contacts the drain region of the active layer 340. Here, the source electrode 360 and the drain electrode 370 may be formed using a metal such as Aluminum (Al), Chromium (Cr), Molybdenum (Mo), Molybdenum-Tungsten (MoW), etc. In some embodiments, the source electrode 360 and the drain electrode 370 are formed by depositing a metal on the active layer 340 and by patterning the metal deposited on the active layer 340. The metal deposited on the active layer 340 may have a single layer structure or a multiple layer structure. Here, contact areas of the active layer 340 with the source electrode 360 and the drain electrode 370 may be determined when patterning the source electrode 360 and the drain electrode 370. The passivation layer 380 is formed on the active layer 340, the source electrode 360, and the drain electrode 370 to cover the active layer 340, the source electrode 360, and the drain electrode 370. In some embodiments, the passivation layer 380 includes at least one of a silicon oxide layer, a silicon nitride layer, an organic insulation layer, etc. As described above, the oxide semiconductor thin film transistor 300 may endure a high voltage that is applied to the gate electrode 320 because the first area of the gate electrode 320 is greater than the second area of the active layer 340 and may reduce or prevent parasitic capacitances formed between the gate electrode 320 and the active layer 340 because contact areas of the active layer 340 with the source electrode 360 and the drain electrode 370 are decreased. Therefore, the oxide semiconductor thin film transistor 300 may have high durability and high reliability against a high voltage that is applied to the gate electrode 320. As a result, the oxide semiconductor thin film transistor 300 may be used as a fundamental structure for a gate scan circuit, a backplane, etc. of a display device.

Figure 8:
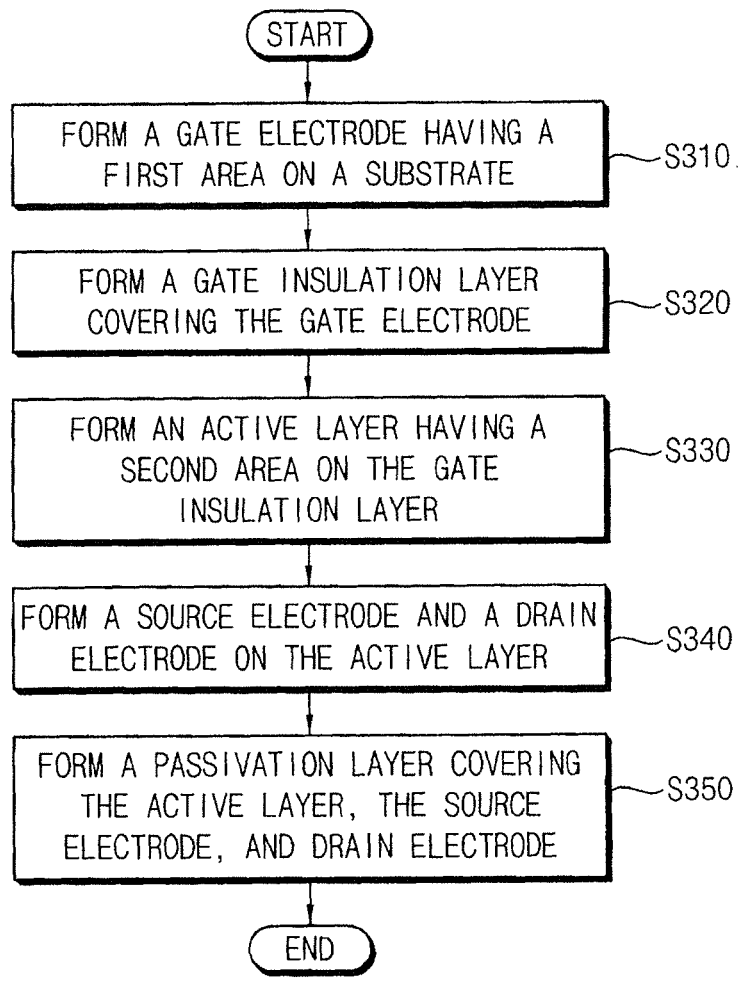
FIG. 8 is a flow chart illustrating a method of manufacturing an oxide semiconductor thin film transistor of FIG. 7 in accordance with one embodiment of the present invention.

FIG. 8 is a flow chart illustrating a method of manufacturing an oxide semiconductor thin film transistor of FIG. 7 in accordance with one embodiment of the present invention.

Referring to FIG. 8, in the method of manufacturing the oxide semiconductor thin film transistor 300 according to one embodiment of the present invention, the gate electrode 320 having the first area may be formed on the substrate 310 (S310). The gate insulation layer 330 is formed on the gate electrode 320 to cover the gate electrode 320 (S320). The active layer 340 having the second area is formed on the gate insulation layer 330 (S330). Here, the second area of the active layer 340 may be smaller than the first area of the gate electrode 320. The source electrode 360 and the drain electrode 370 are formed on the active layer 340 (S340). Here, the source electrode 360 contacts the source region of the active layer 340, and the drain electrode 370 contacts the drain region of the active layer 340. The passivation layer 380 is formed on the active layer 340, the source electrode 360, and the drain electrode 370 (S350) to cover the active layer 340, the source electrode 360, and the drain electrode 370.

The gate electrode 320 having the first area is formed on the substrate 310 (S310). As described above, the first area of the gate electrode 320 may be greater than the second area of the active layer 340. In some embodiments, the gate electrode 320 is formed by depositing a metal on the substrate 310 and by patterning the metal deposited on the substrate 310. Then, the gate insulation layer 330 is formed on the gate electrode 320 to cover the gate electrode 320 (S320). Here, the gate insulation layer 330 has a protrusion 332 (e.g., a raised portion) at a region corresponding to the central region of the gate electrode 320. As described above, the third area of the protrusion 332 of the gate insulation layer 330 is smaller than the second area of the active layer 340. In addition, the protrusion 332 of the gate insulation layer 330 determines a shape of the active layer 340 that is formed on the gate insulation layer 330. Then, the active layer 340 having the second area is formed on the gate insulation layer 330 (S330). Here, the active layer 340 has a shape bent by the protrusion 332 of the gate insulation layer 330. For example, the central region of the active layer 340 protrudes compared to (e.g., is raised in comparison to) the peripheral region of the active layer 340. As a result, the active layer 340 includes a step height region between the central region and the peripheral region. The active layer 340 spatially overlaps the gate electrode 320 (e.g., the active layer 340 may be placed over the gate electrode 320).

Then, the source electrode 360 and the drain electrode 370 are formed on the active layer 340 (S340). As described above, the source electrode 360 contacts the source region of the active layer 340, and the drain electrode 370 contacts the drain region of the active layer 340. In some embodiments, the source electrode 360 and the drain electrode 370 are formed by depositing a metal on the active layer 340 and by patterning the metal deposited on the active layer 340. Here, contact areas of the active layer 340 with the source electrode 360 and the drain electrode 370 may be determined when patterning the source electrode 360 and the drain electrode 370. Subsequently, the passivation layer 380 is formed on the active layer 340, the source electrode 360, and the drain electrode 370 (S350). According to some embodiments, a buffer layer is placed between the substrate 310 and the gate electrode 320, and a surface stabilization layer may be placed between the active layer 340 and the gate insulation layer 330.

Therefore, the method of FIG. 8 may be used to manufacture the oxide semiconductor thin film transistor 300 in which the first area of the gate electrode 320 is greater than the second area of the active layer 340, and contact areas of the active layer 340 with the source electrode 360 and the drain electrode 370 are decreased. As a result, the oxide semiconductor thin film transistor 300 may have high durability and high reliability against a high voltage that is applied to the gate electrode 320. In reference to FIGS. 9A, 9B, 9C, 9D, 9E, and 9F below, a manufacturing process of the oxide semiconductor thin film transistor 300 will be described in more detail.

FIGS. 9A, 9B, 9C, 9D, 9E, and 9F are cross-sectional views illustrating a manufacturing process of an oxide semiconductor thin film transistor of FIG. 7 in accordance with one embodiment of the present invention.

Figure 9A:
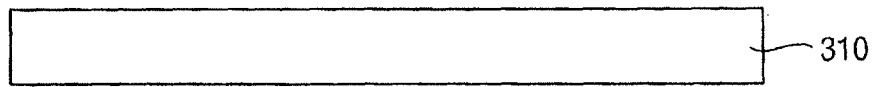
FIGS. 9A, 9B, 9C, 9D, 9E, and 9F are cross-sectional views illustrating a manufacturing process of an oxide semiconductor thin film transistor of FIG. 7 in accordance with one embodiment of the present invention.

Referring to FIG. 9A, the substrate 310 may be provided. For example, the substrate 310 may be a silicon semiconductor substrate, a glass substrate, a plastic substrate, etc.

Figure 9B:
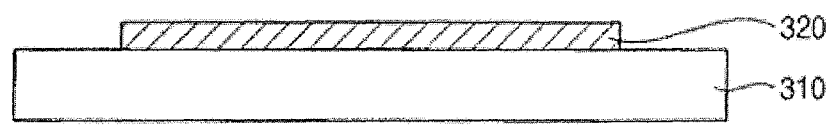

Referring to FIG. 9B, the gate electrode 320 is formed on the substrate 310. Here, the first area of the gate electrode 320 may be greater than the second area of the active layer 340. As a result, the active layer 340 may spatially overlap the gate electrode 320 (e.g., the active layer 340 may be placed over the gate electrode 320). The gate electrode 320 may be formed using a conductive polymer or a metal such as Aluminum (Al), Chromium (Cr), Molybdenum (Mo), Molybdenum-Tungsten (MoW), etc. In some embodiments, the gate electrode 320 is formed by depositing a metal on the substrate 310 and by patterning the metal deposited on the substrate 310. Here, the metal deposited on the substrate 310 may have a single layer structure or a multiple layer structure. According to some embodiments, a buffer layer is placed between the substrate 310 and the gate electrode 320. The buffer layer may perform a buffering function between the substrate 310 and the gate electrode 320. In embodiments in which the buffer layer is placed between the substrate 310 and the gate electrode 320, the gate electrode 320 is formed by depositing a metal on the buffer layer and by patterning the metal deposited on the buffer layer.

Figure 9C:
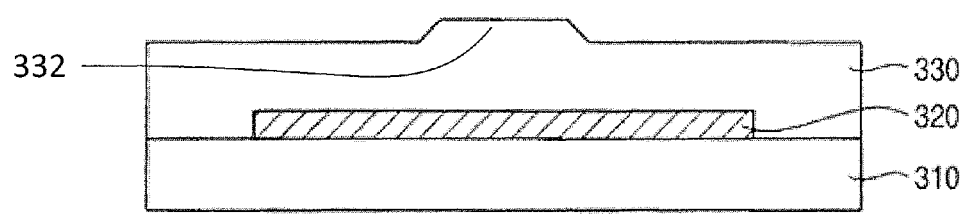

Referring to FIG. 9C, the gate insulation layer 330 is formed on the gate electrode 320 by covering the gate electrode 320. Here, the gate insulation layer 330 may be formed using an insulation material (e.g., $SiO_2$, $SiN_x$, $Ga_2O_3$, etc.) such as a silicon oxide, a silicon nitride, etc. Thus, the gate insulation layer 330 may insulate the gate electrode 320 from the active layer 340. In some embodiments, the gate insulation layer 330 has a protrusion 332 (e.g., a raised portion) at a region corresponding to the central region of the gate electrode 320. Here, the third area of the protrusion 332 of the gate insulation layer 330 is smaller than the second area of the active layer 340. Further, the protrusion 332 of the gate insulation layer 330 may determine a shape of the active layer 340 that is formed on the gate insulation layer 330. As a result, the active layer 340 may have a shape bent by the protrusion 332 of the gate insulation layer 330. For example, the central region of the active layer 340 may protrude compared to (e.g., may be raised in comparison to) the peripheral region of the active layer 340. According to some embodiments, the surface stabilization layer (e.g., an oxide layer) is formed on the gate insulation layer 330.

Figure 9D:
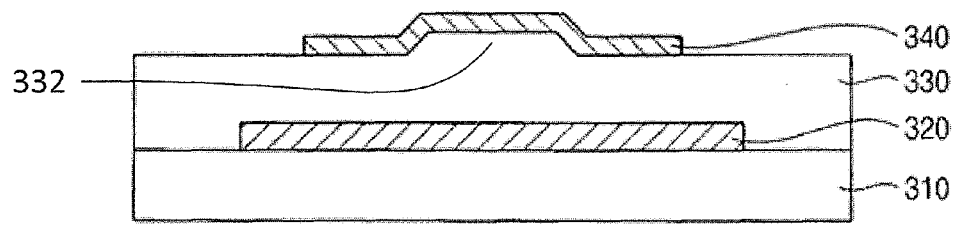

Referring to FIG. 9D, the active layer 340 is formed on the gate insulation layer 330. As described above, the active layer 340 spatially overlaps the gate electrode 320 (e.g., the active layer 340 may be placed over the gate electrode 320). Here, the second area of the active layer 340 is smaller than the first area of the gate electrode 320 and is greater than the third area of the protrusion 332 of the gate insulation layer 330. Thus, the active layer 340 has a shape bent by the protrusion 332 of the gate insulation layer 330. For example, the central region of the active layer 340 protrudes compared to (e.g., is raised in comparison to) the peripheral region of the active layer 340. As a result, the active layer 340 includes a step height region between the central region and the peripheral region. Typically, the active layer 340 includes a channel region, a source region, and a drain region. Here, the central region of the active layer 340 includes the channel region, and the peripheral region of the active layer 340 includes the source region and the drain region.

The active layer 340 may be formed using an oxide material. In more detail, the active layer 340 may be formed using an oxide material that includes at least one of indium (In), zinc (Zn), gallium (Ga), or tin (Sn). In addition, the oxide material may further include at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F). For example, the active layer 340 may be formed using an oxide material such as ZnO, ZnGaO, ZnInO, ZnSnO, GaInZnO, SnO2, CdSnO, GaSnO, TiSnO, CuAlO, SrCuO, LaCuOS, etc. However, an oxide material of the active layer 340 is not limited thereto.

In some embodiments, the active layer 340 is formed by depositing an oxide material on the gate insulation layer 330 using a physical vapor deposition (PVD) technique (e.g., a sputtering technique, an electron beam evaporation technique, a thermal evaporation technique, a laser molecular beam epitaxy evaporation technique, a pulsed laser deposition technique, etc.) and by patterning the oxide material deposited on the gate insulation layer 330. Here, an electron carrier concentration of the oxide material of the active layer 340 may be from about $10^{12}/cm^3$ to about $10^{18}/cm^3$. As a result, the oxide semiconductor thin film transistor 300 may reduce leakage currents in an off-state, may increase saturation currents in a pinch-off state and may enhance on-off characteristics.

Figure 9E:
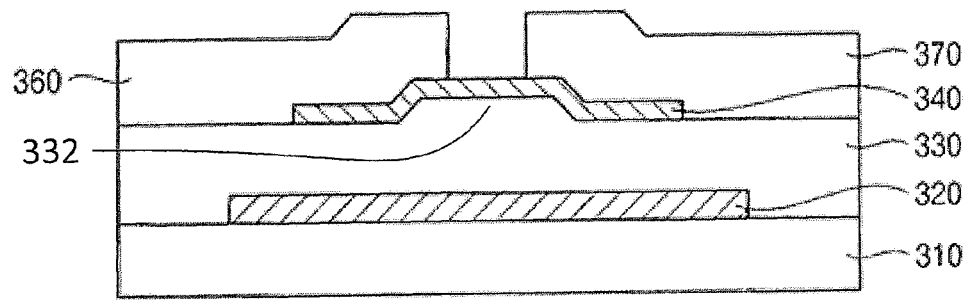

Referring to FIG. 9E, the source electrode 360 and the drain electrode 370 are formed on the active layer 340. As described above, the source electrode 360 and the drain electrode 370 may be formed using a metal such as Aluminum (Al), Chromium (Cr), Molybdenum (Mo), Molybdenum-Tungsten (MoW), etc. In some embodiments, the source electrode 360 and the drain electrode 370 are formed by depositing a metal on the active layer 340 and by patterning the metal deposited on the active layer 340. Here, the metal deposited on the active layer 340 may have a single layer structure or a multiple layer structure. Furthermore, contact areas of the active layer 340 with the source electrode 360 and the drain electrode 370 may be determined by patterning the source electrode 360 and the drain electrode 370. As a result, the source electrode 360 and the drain electrode 370 may contact the source region of the active layer 340 and the drain region of the active layer 340, respectively.

Figure 9F:
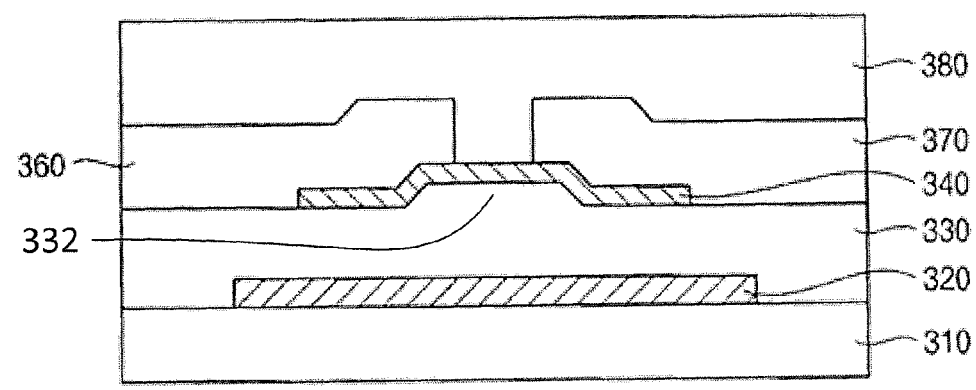

Referring to FIG. 9F, the passivation layer 380 is formed on the active layer 340, the source electrode 360, and the drain electrode 370 to cover the active layer 340, the source electrode 360, and the drain electrode 370. In some embodiments, the passivation layer 380 is formed by depositing at least one of a silicon oxide layer, a silicon nitride layer, an organic insulation layer, etc. As described above, the oxide semiconductor thin film transistor 300 may endure a high voltage that is applied to the gate electrode 320 because the first area of the gate electrode 320 is greater than the second area of the active layer 340 and may reduce or prevent parasitic capacitances formed between the gate electrode 320 and the active layer 340 because contact areas of the active layer 340 with the source electrode 360 and the drain electrode 370 are decreased. Therefore, the oxide semiconductor thin film transistor 300 may have high durability and high reliability against a high voltage that is applied to the gate electrode 320. As a result, the oxide semiconductor thin film transistor 300 may be used as a fundamental structure for a gate scan circuit, a backplane, etc. of a display device.

Figure 10:
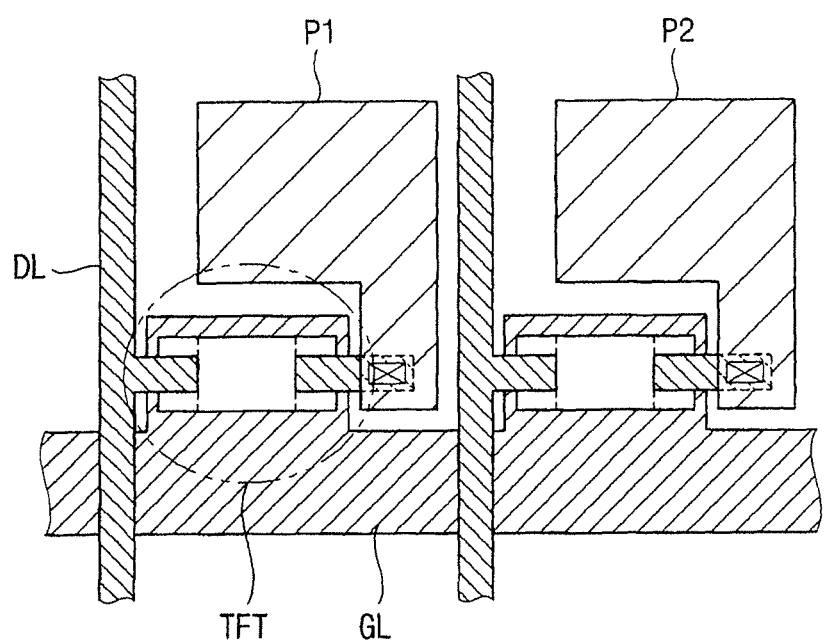
FIG. 10 is a diagram illustrating a backplane of a display device using an oxide semiconductor thin film transistor in accordance with embodiments of the present invention.

FIG. 10 is a diagram illustrating a backplane of a display device using an oxide semiconductor thin film transistor in accordance with embodiments of the present invention.

Referring to FIG. 10, the backplane 1000 of the display device includes a plurality of pixels P1 and P2 in regions corresponding to intersections of a plurality of gate lines GL and a plurality of data lines DL. Each of the pixels P1 and P2 may include a switching element, a liquid crystal capacitor, and a storage capacitor. Here, an oxide semiconductor thin film transistor TFT may be used as the switching element.

The oxide semiconductor thin film transistor TFT may be formed on a lower display substrate and is coupled to the gate line GL, the data line DL, and the liquid crystal capacitor. As a result, the oxide semiconductor thin film transistor TFT may provide a data signal output from the data line DL to the liquid crystal capacitor in accordance with a gate signal supplied from the gate line GL. In more detail, the oxide semiconductor thin film transistor TFT may be coupled to the gate line GL via its gate electrode, may be coupled to the data line DL via its source electrode and may be coupled to the liquid crystal capacitor via its drain electrode. Generally, the liquid crystal capacitor includes a pixel electrode that is formed on a lower display substrate, a common electrode that is formed on an upper display substrate, and a liquid crystal layer that is located between the pixel electrode and the common electrode. In FIG. 10, the pixel electrode coupled to the oxide semiconductor thin film transistor TFT is illustrated as the liquid crystal capacitor. The liquid crystal capacitor may be charged by a potential difference between a data signal applied to the pixel electrode and a common voltage applied to a common electrode. Here, light transmittance of the liquid crystal layer may be controlled in accordance with the potential difference between the data signal applied to the pixel electrode and the common voltage applied to a common electrode.

As illustrated in FIG. 10, the oxide semiconductor thin film transistor TFT may have a bottom gate structure (e.g., a reverse staggered structure). In one embodiment of the present invention, the oxide semiconductor thin film transistor TFT includes a substrate, a gate electrode, a gate insulation layer, an active layer, a source electrode, a drain electrode, and a passivation layer. In another embodiment of the present invention, the oxide semiconductor thin film transistor TFT includes a substrate, a gate electrode, a gate insulation layer, an active layer, an etch stopper layer, a source electrode, a drain electrode, and a passivation layer. Because the oxide semiconductor thin film transistor TFT was described above, descriptions of the oxide semiconductor thin film transistor TFT will be omitted. As described above, the oxide semiconductor thin film transistor TFT may endure a high voltage that is applied to its gate electrode because a first area (e.g., width) of its gate electrode is greater than a second area (e.g., width) of its active layer and may reduce or prevent parasitic capacitances formed between its gate electrode and its active layer because its etch stopper layer (or, a patterning of its source electrode and its drain electrode) decreases contact areas of its active layer with its source electrode and its drain electrode.

Figure 11A:
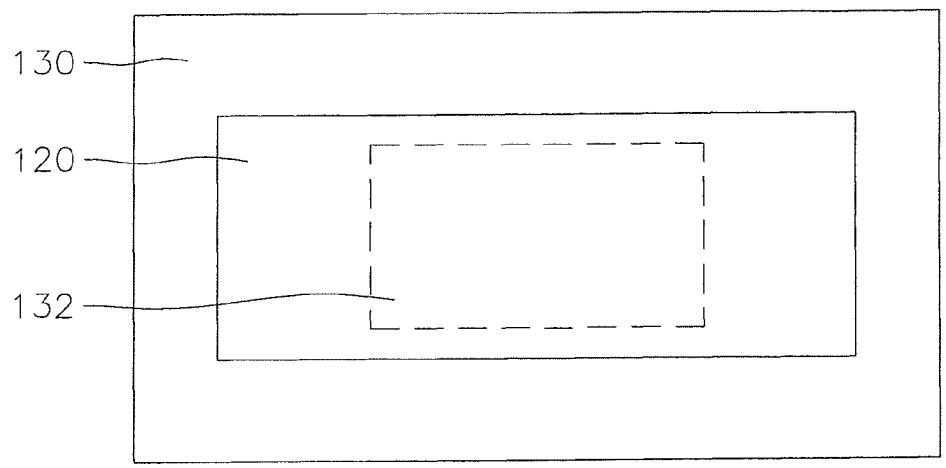
FIGS. 11A and 11B are plan views illustrating a structure of an oxide semiconductor thin film transistor in accordance with one embodiment of the present invention.
Figure 11B:
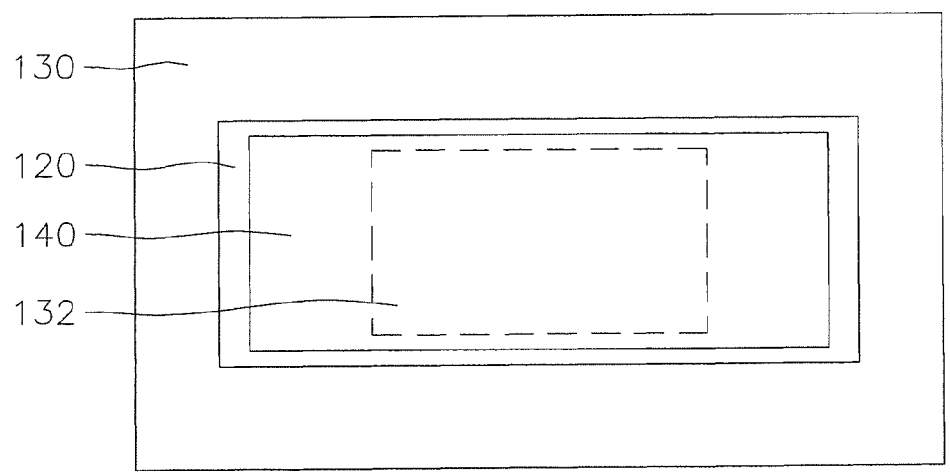

FIGS. 11A and 11B are plan views illustrating a structure of an oxide semiconductor thin film transistor in accordance with one embodiment of the present invention. FIG. 11A is a plan view illustrating the structure shown in FIG. 4C and FIG. 11B is a plan view illustrating the structure shown in FIG. 4D. As seen in FIG. 11B, the gate electrode 120 has an area (e.g., width) greater than an area (e.g., width) of the active layer 140. In addition, in the embodiment shown in FIG. 11B, the area of the protrusion 132 of the gate insulation layer 130 is smaller than the area of the active layer 140.

Embodiments of the present invention may be applied to a display device, and an electric device having the display device. Thus, embodiments of the present invention may be applied to a computer monitor, a digital television, a laptop, a digital camera, a video camcorder, a cellular phone, a smart phone, a portable multimedia player (PMP), a personal digital assistant (PDA), a MP3 player, a navigation device, a video phone, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific embodiments disclosed and that modifications to the disclosed embodiments, as well as other embodiments, are intended to be included within the scope of the appended claims and equivalents thereof.

What is claimed is:

1. An oxide semiconductor thin film transistor, comprising:
    a gate electrode on a substrate, the gate electrode having a first area;
    a gate insulation layer on the gate electrode, the gate insulation layer covering the gate electrode;
    an active layer on the gate insulation layer, the active layer having a second area that is smaller than the first area;
    a source electrode on the active layer, the source electrode contacting a source region of the active layer;
    a drain electrode on the active layer, the drain electrode contacting a drain region of the active layer; and
    a passivation layer covering the active layer, the source electrode, and the drain electrode,
    wherein the gate insulation layer includes a protrusion having a third area that is smaller than the second area of the active layer, and
    wherein the third area of the protrusion is smaller than the first area of the gate electrode.

2. The transistor of claim 1, wherein a central region of the active layer is raised in comparison to a peripheral region of the active layer in a region corresponding to the protrusion of the gate insulation layer.

3. The transistor of claim 2, wherein the central region of the active layer includes a channel region of the active layer, and
    wherein the peripheral region of the active layer includes the source region of the active layer and the drain region of the active layer.

4. The transistor of claim 1, further comprising:
    an etch stopper layer between the active layer and both of the source electrode and the drain electrode.

5. The transistor of claim 4, wherein the etch stopper layer has a contact hole structure in which the source electrode and the drain electrode contact the active layer through a plurality of contact holes in the etch stopper layer.

6. The transistor of claim 4, wherein the etch stopper layer has an island structure in which the source electrode and the drain electrode contact a peripheral region of the active layer, the peripheral region having the source region and the drain region.

7. The transistor of claim 1, wherein the active layer comprises an oxide material that includes at least one of indium (In), zinc (Zn), gallium (Ga), or tin (Sn).

8. The transistor of claim 7, wherein the oxide material further includes at least one of lithium (Li), Sodium (Na), manganese (Mn), nickel (Ni), palladium (Pd), copper (Cu), cadmium (Cd), carbon (C), nitrogen (N), phosphorus (P), titanium (Ti), zirconium (Zr), hafnium (Hf), vanadium (V), ruthenium (Ru), germanium (Ge), or fluorine (F).

9. The transistor of claim 7, wherein an electron carrier concentration of the oxide material is from about $10^{12}/cm^3$ to about $10^{18}/cm^3$.

10. A method of manufacturing an oxide semiconductor thin film transistor, the method comprising:
    forming a gate electrode on a substrate, the gate electrode having a first area;
    forming a gate insulation layer on the gate electrode, the gate insulation layer covering the gate electrode;
    forming an active layer on the gate insulation layer, the active layer having a second area that is smaller than the first area;
    forming a source electrode and a drain electrode on the active layer, the source electrode contacting a source region of the active layer, and the drain electrode contacting a drain region of the active layer;
    forming a passivation layer covering the active layer, the source electrode, and the drain electrode; and
    forming an etch stopper layer between the active layer and both of the source electrode and the drain electrode,
    wherein the third area of the protrusion is smaller than the first area of the gate electrode.

11. The method of claim 10, wherein the gate insulation layer includes a protrusion having a third area that is smaller than the second area of the active layer.

12. The method of claim 11, wherein a central region of the active layer is raised in comparison to a peripheral region of the active layer in a region corresponding to the protrusion of the gate insulation layer.

13. The method of claim 12, wherein the central region of the active layer includes a channel region of the active layer, and
    wherein the peripheral region of the active layer includes the source region of the active layer and the drain region of the active layer.

* * * * *